United States Patent [19]
Katoh et al.

[11] Patent Number: 5,670,790
[45] Date of Patent: Sep. 23, 1997

[54] ELECTRONIC DEVICE

[75] Inventors: Riichi Katoh, Yokohama; Tetsufumi Tanamoto; Shigeki Takahashi, both of Kawasaki, all of Japan

[73] Assignee: Kabushikik Kaisha Toshiba, Kawasaki, Japan

[21] Appl. No.: 718,186

[22] Filed: Sep. 19, 1996

[30] Foreign Application Priority Data

Sep. 21, 1995 [JP] Japan .................................. 7-242246
Mar. 26, 1996 [JP] Japan .................................. 8-069588

[51] Int. Cl.$^6$ ..................... H01L 29/06; H01L 31/0328; H01L 31/0336; H01L 31/072
[52] U.S. Cl. ..................... 257/14; 257/17; 257/20; 257/23; 257/24; 257/30
[58] Field of Search ..................... 257/14, 23, 27, 257/30, 15, 17, 20, 24, 25

[56] References Cited

FOREIGN PATENT DOCUMENTS 6-277761  11/1994  Japan .
6-277905  11/1994  Japan .

OTHER PUBLICATIONS

Sandip Tiwari, et al., "Volatile And Non–Volatile Memories In Silicon With Nano–Crystal Storage", IEDM Technical Digest, 1995, pp. 95–521 to 95–524.

*Primary Examiner*—Sara W. Crane
*Assistant Examiner*—Douglas Wille
*Attorney, Agent, or Firm*—Oblon, Spivak, McClelland, Maier & Neustadt, P.C.

[57] ABSTRACT

An electronic device which includes, a couple of first conduction regions which are capable of confining carriers, a second conduction region having a higher energy level than those of the first conduction regions, and a first electrode for impressing a voltage on the first conduction regions, wherein when a voltage is impressed via the first electrode between the couple of first conduction regions, carriers are caused to move due to a tunneling effect from one of the first conduction regions via the second conduction region to the other of the first conduction regions, and when the voltage impressed between the couple of first conduction regions is removed, carriers are confined mainly in the one of the first conduction regions.

21 Claims, 6 Drawing Sheets

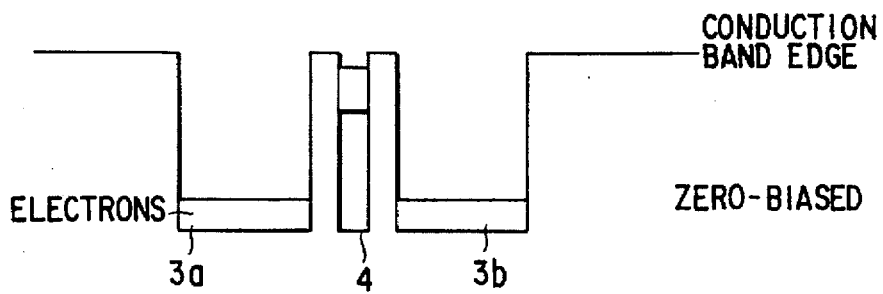
F I G. 1A
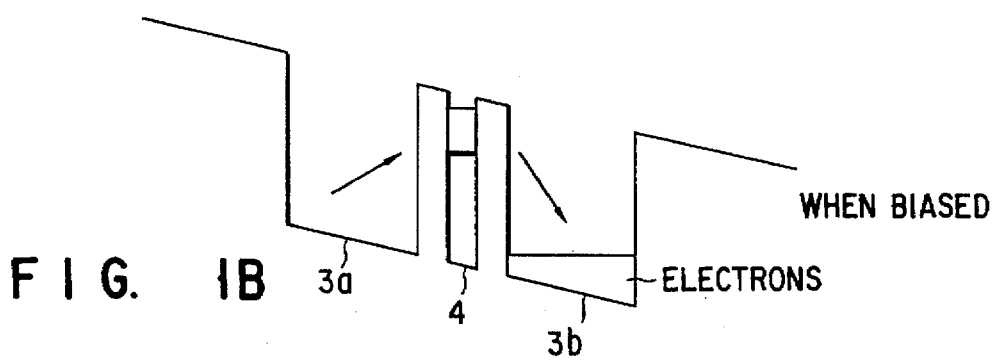
F I G. 1B
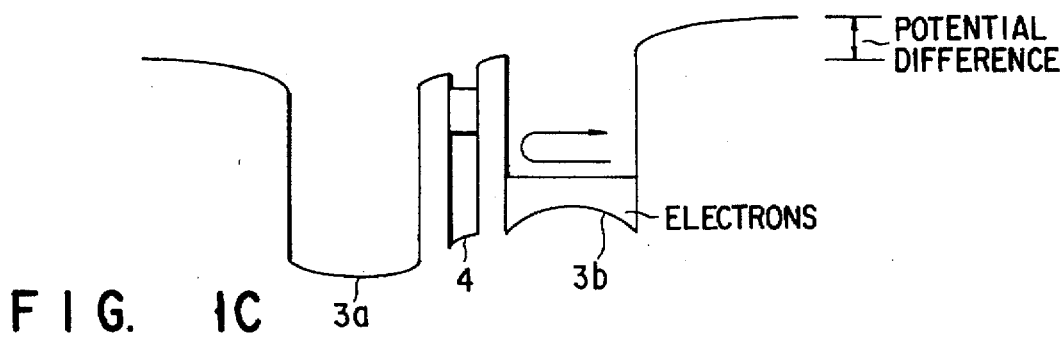
F I G. 1C
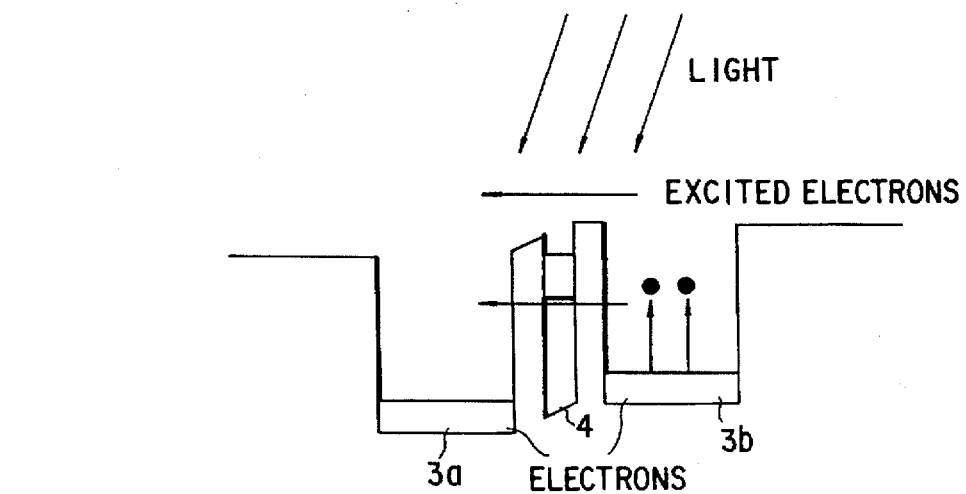
F I G. 2

ZERO-BIASED

WHEN BIASED

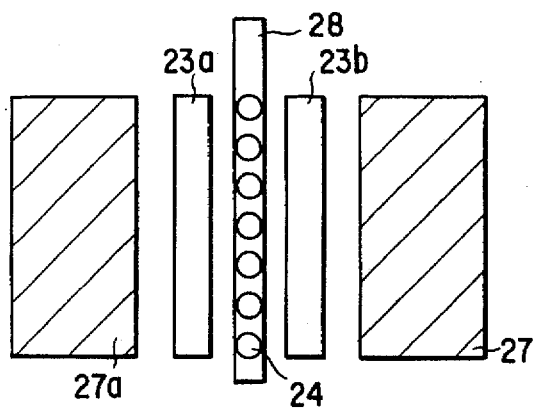
F I G. 10
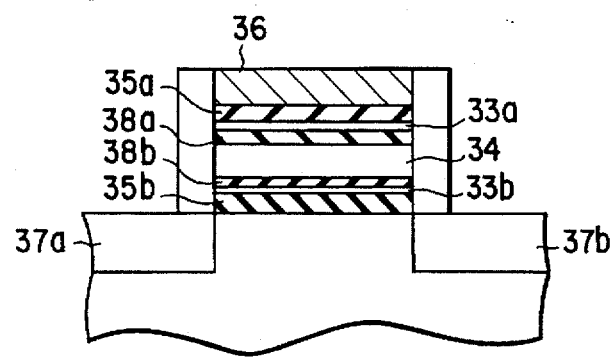
F I G. 11
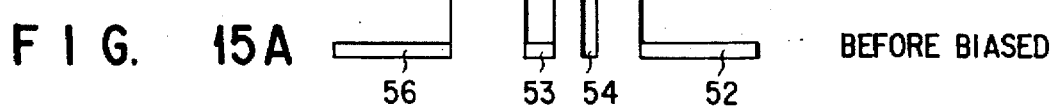
F I G. 15A BEFORE BIASED
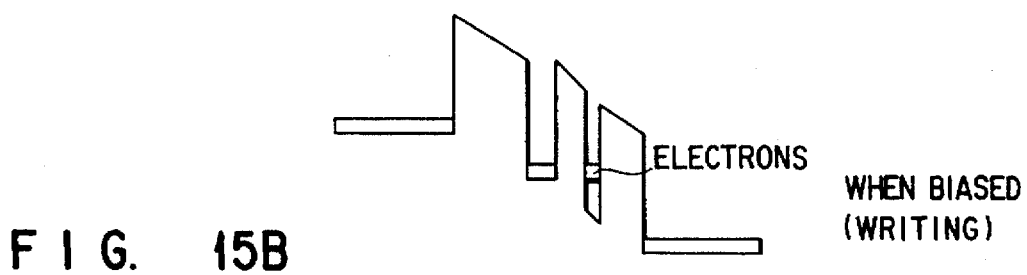
F I G. 15B WHEN BIASED (WRITING)
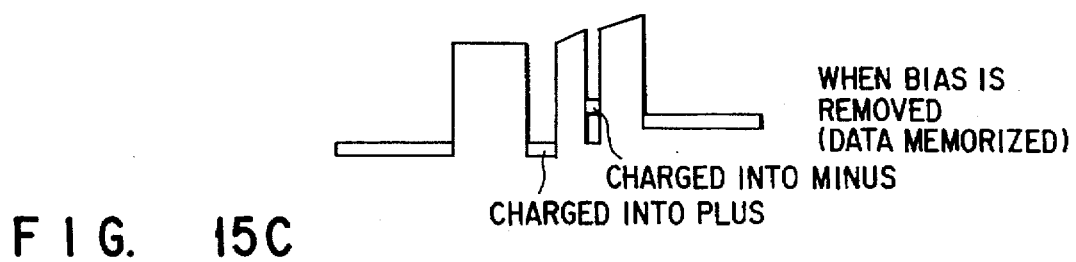
F I G. 15C WHEN BIAS IS REMOVED (DATA MEMORIZED) CHARGED INTO MINUS CHARGED INTO PLUS

ELECTRONIC DEVICE

BACKGROUND OF THE INVENTION

1. Field of the Invention

This invention relates to an electronic device, and in particular to a novel memory device of ultra-low power consumption.

2. Description of the Related Art

The circuit of the conventional typical semiconductor memory is generally constituted by a single MOS transistor, and a capacitor for storing electric charge. In this semiconductor memory, the memory is fundamentally effected by distinguishing the charge-storage condition of the capacitor from the charge-free condition of the capacitor by making use of a couple of numerals, i.e. "1" and "0", respectively. In order to produce the charge-storage condition of the capacitor in this semiconductor memory, it is required to turn on the transistor so as to allow electric current to pass into the capacitor thereby carrying out the charging of the capacitor.

On the other hand, there is known a semiconductor memory which is called a floating gate type memory. This floating gate type memory is featured in that a conduction layer consisting of polycrystalline silicon for storing electric charge is buried in the gate-insulating film of a MOS transistor. A thin insulating film called a tunneling insulating film is formed between the conduction layer and the channel. When a high positive gate bias is impressed onto the channel in this floating gate type memory, electrons are injected due to the tunneling effect from the channel into the buried conduction layer via a thin oxide layer, thereby effecting the storage of electron in the conduction layer. The electron once stored in this buried conduction layer are kept retained therein without running away into the channel for instance until a high negative gate bias is applied to the channel. Since there is a difference, if the gate voltage is kept constant, between the drain current to be generated as a voltage is applied between the source region and the drain region under the condition where electrons are stored in the buried conduction layer, and the drain current to be generated as a voltage is applied between the source region and the drain region under the condition where electrons are not stored in the buried conduction layer, this floating gate type memory can be actuated as a non-volatile memory.

However, since a sufficient amount of electron for substantially changing the drain current are required to be stored in this buried conduction layer in the case of this floating gate type memory, the charging and discharging of the charge stored in the buried conduction layer are also required to be effected by passing an electric current through the buried conduction layer in the same manner as in the case of storing electrons in the capacitor. Moreover, in order to maintain a sufficient non-volatility, the thickness of the insulating film between the buried conduction layer and the channel is required to be sufficiently large enough to prevent electrons from easily tunneling under a low bias, so that the application of a high voltage is required for effecting the charging and discharging the electrons in the conduction layer.

As explained above, the conventional semiconductor memory provided with a transistor and a capacitor has a drawback that a large power consumption is inevitably required since an electric current is required to pass through the capacitor thereby carrying out the charging/discharging of the capacitor. In the case of the floating gate type memory also, an electric current is required to pass through for effecting the charging and discharging of the electrons in the buried conduction layer in the gate insulating layer. Moreover, the voltage required for effecting the charging and discharging of the electrons in this case is required to be fairly higher than the ordinary transistor-operating voltage, thus also giving rise to the problem of large power consumption.

SUMMARY OF THE INVENTION

Accordingly, an object of the present invention is to provide an electronic device of novel structure, which is capable of being operated with ultra-low power consumption, i.e. little current is required for effecting the operation of the device.

Another object of the present invention is to provide a non-volatile semiconductor memory which is capable of retaining a data even in the condition of OFF.

Namely, according to the present invention, there is provided an electronic device which comprises;

a couple of first conduction regions which are capable of confining carriers;

a second conduction region having a higher energy level than those of the first conduction regions; and a first electrode for impressing a voltage on the first conduction regions;

Wherein when a voltage is impressed via the first electrode between the couple of first conduction regions, carriers are caused to move due to a tunneling effect from one of the first conduction regions via the second conduction region to the other of the first conduction regions; and when the voltage impressed between the couple of first conduction regions is removed, carriers are confined mainly in the one of the first conduction regions.

According to the present invention, there is further provided an electronic device which comprises;

a first conduction region and a second conduction region both of which are capable of confining carriers;

a third conduction region wherein carriers are free to move;

a first electrode for impressing a voltage on the first conduction region; and a second electrode and a third electrode each functioning as an input and an output for passing an electric current to the third conduction region;

which is featured in that an insulating layer or an energy barrier layer is interposed between the first electrode and the first conduction region, between the first conduction region and the second conduction region, and between the second conduction region and the third conduction region; and that when a voltage is impressed between the first electrode and the second or third electrode, or between the first electrode and the second and third electrodes, carriers are caused to move due to a tunneling effect between the first conduction regions and the second conduction region, while the carriers are inhibited from moving between the first electrode and the first conduction region as well as between the second conduction region and the third conduction region; and when the voltage impressed is removed, carriers are confined mainly in either the first conduction region or the second conduction region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A to 1C are band-diagrams illustrating the operational principle of an electronic device according to a first embodiment of this invention;

FIG. 2 is a band-diagram illustrating the operational principle of an electronic device according to a first embodiment of this invention;

FIG. 10 is a plan view showing a semiconductor memory device according to a sixth example of this invention;

FIG. 11 is a plan view showing a semiconductor memory device according to a seventh example of this invention;

FIGS. 15A to 15C illustrate respectively a band-diagram illustrating the operational principle of an electronic device according to a ninth embodiment of this invention.

DETAILED DESCRIPTION OF THE PREFERRED EMBODIMENTS

Figure 3A:
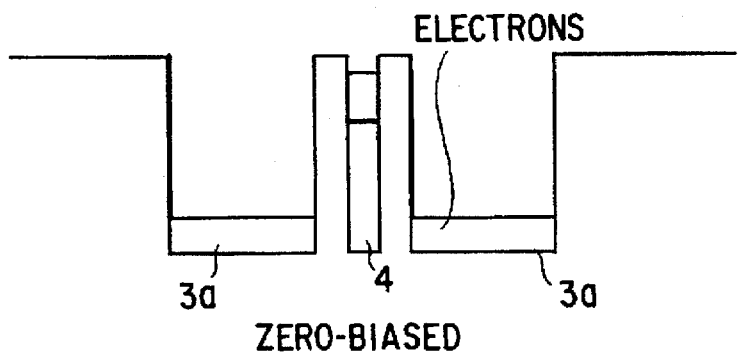
FIGS. 3A to 3C are band-diagrams illustrating the operational principle of an electronic device according to a second embodiment of this invention.

This invention will be further explained in detail with reference to preferred embodiments.

The term "Carrier(s)" recited herein should be understood to mean "electron(s)" or "hole(s)". Further, the phrase "a region capable of confining carriers" appearing herein should be understood to mean "a region whose whole surfaces, i.e. top and bottom surfaces as well as four peripheral surfaces are surrounded by a high energy barrier so as to making it possible to confine carriers therein".

FIGS. 1A to 1C are band-diagrams illustrating the operational principle of an electronic device according to a first embodiment of this invention;

This electronic device shown in FIGS. 1A to 1C is constructed such that a second conduction region 4 is interposed between a couple of first conduction regions 3a and 3b.

FIG. 1A illustrates a state of band-diagram wherein no voltage is applied to the electronic device, and hence the first conduction regions 3a and 3b are ready to confine electrons. In this embodiment, the second conduction region 4 is three-dimensionally quantized. The energy level of the second conduction region 4 is set such that even the lowest energy level thereof would be higher than the energy levels of the first conduction regions 3a and 3b. The first conduction regions 3a and 3b are not quantized, and the energy level of electrons is set substantially in succession so that the electrons are stored uniformly at the bottom of the conduction band.

When a potential difference is caused to be generated between the first conduction regions 3a and 3b so as to make the Fermi level of one of the first conduction regions 3a and 3b higher than that of the other as shown in FIG. 1B, the electrons are caused to move via the second conduction region 4 from the above-mentioned one of the first conduction regions, i.e. the first conduction region 3a to the other, i.e. the first conduction region 3b. The movement of electrons in this case is effected mainly through a tunneling effect.

Even if the bias between the first conduction regions 3a and 3b is cut off under this condition, the electrons are kept confined in the first conduction region 3b, since the quantum level (energy level) of the second conduction region 4 is high as shown in FIG. 1C, thus generating a potential difference between the first conduction regions 3a and 3b. Therefore, if these "+" and "−" potentials are identified with the numerals, 1 and 0, it is possible to utilize them for the construction of a non-volatile memory.

In this case, if the quantization level of the second conduction region 4 is set to a sufficiently high level, the transfer of electrons would not be caused by such a low potential difference as those to be generated by a thermal noise or by a noise from an external electric field.

FIG. 2 illustrates the operational principle of an electronic device as light (ultra-violet rays) is irradiated onto the electronic device which is in the state shown in FIG. 1C. The electrons in the first conduction region 3b, i.e. positioned at the right side in FIG. 2, are excited by the irradiation of light and hence caused to diffuse, by passing over or tunneling through the barrier, into the first conduction region 3a positioned at the left side in FIG. 2, thus erasing the memory stored.

As explained above, according to this electronic device, the electrons confined in the first conduction regions 3a and 3b are simply caused to move left and right just in the case of a seesaw, so that the supply of current flow via the electrode is little required for the movement of electrons, thus making it possible to realize a memory which can be operated with ultra-low power consumption.

In the above embodiment, a quantum dot which is three-dimensionally quantized is employed as the second conduction region, and at the same time, a semiconductor confinement region which is not quantized is employed as the first conduction region. However, it is also possible to employ a two-dimensionally quantized conduction region as the second conduction region and at the same time, to employ a one- or two-dimensionally quantized conduction region as the first conduction region.

Namely, since the base energy level of the second conduction region that can be effected by the quantization for confinement is only required to be lower than the energy of electrons in the first conduction region, such a condition can be met even with a two-dimensional quantization. As for the first conduction region, even if a one- or two-dimensionally quantized conduction region is employed as the first conduction region, it would not raise any problem as far as the energy level of the first conduction region can be set lower than the energy level of the second conduction region.

The phrase "a one-dimensionally quantized conduction region" appearing herein should be understood to mean "an extremely thin and planar quantum well layer sandwiched between high potential barriers". Specifically, a thin GaAS layer sandwiched between AlGaAs layers, a thin Si layer sandwiched between $SiO_2$ layers, or the like may be employed as such a one-dimensionally quantized conduction region. The phrase "a two-dimensionally quantized conduction region" appearing in this description should be understood to mean "a linear quantum thin wire surrounded by high potential barriers". Specifically, a linear quantum thin wire of GaAs surrounded by AlGaAs, a linear quantum thin wire of Si surrounded by $SiO_2$, or the like, like the quantum well, may be employed as such a two-dimensionally quantized conduction region. The phrase "a three-dimensionally quantized conduction region" appearing in this description should be understood to mean "a dot-like quantum box surrounded by surrounded by high potential barriers". Specifically, a quantum box of GaAs surrounded by AlGaAs, a quantum box of Si surrounded by $SiO_2$, or the like, like the quantum well, may be employed as such a three-dimensionally quantized conduction region.

It may be advantageous to employ a quantized region for the first conduction region for assuring an accurate operation since such a quantized first conduction region would permit the operation voltage of the device to be set in a more discrete manner. In this case, the first and second conduction regions may be formed by making the most of a difference in band gap or electron affinity of semiconductor materials.

In the aforementioned embodiment, it is explained on the assumption that there is an energy barrier between the first conduction region and the second conduction region. However, what is required for the operation of the device is to make the energy level of the second conduction region higher than the energy level of the first conduction region, so that the second conduction region may be constituted with an energy barrier layer which is equivalent to the energy barrier layer interposed between the first conduction region and the second conduction region.

In this case, the movement of electrons between a couple of the first conduction regions for the operation of memory is effected not by the tunneling effect by making use of the quantum level of the second conduction region, but by the tunneling effect of the electrons directly through the energy barrier region, by the "Fowler-Nordheim Tunneling" of electrons through a triangular potential to be generated in the energy barrier region when a voltage is applied thereto, or by the jumping of electrons over the energy barrier region.

Figure 3B:
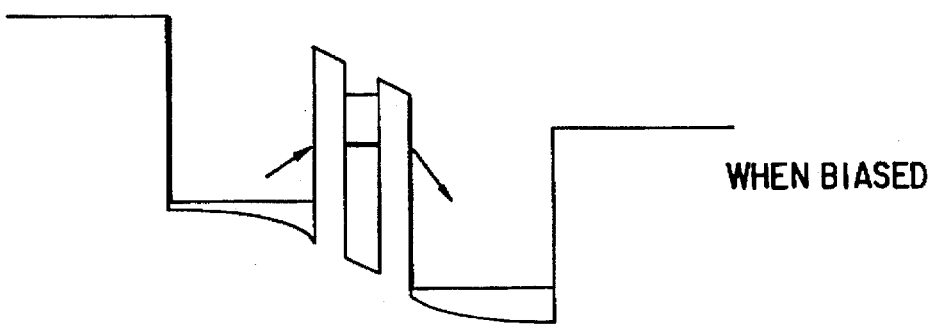
Figure 3C:
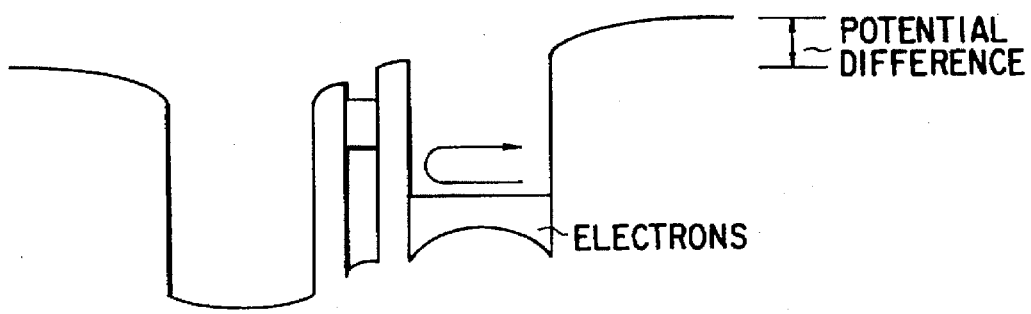

FIGS. 3A to 3C are band-diagrams illustrating the operational principle of an electronic device according to a second embodiment of this invention.

In this embodiment, an electrode is attached to the second conduction region of the electronic device of the first embodiment, whereby making it possible to apply a voltage thereto.

FIG. 3A illustrates a state of band-diagram wherein no voltage is applied to the electronic device, and hence the first conduction regions 3a and 3b are ready to confine electrons as in the case of FIG. 1A of the first embodiment.

When a potential difference is caused to be generated between the second conduction region 4 and the first conduction regions 3a and 3b, and also between the first conduction regions 3a and 3b as shown in FIG. 3B, the Fermi level of electrons in the first conduction region 3a disposed at the left side of FIG. 3B approaches close to the energy level of the second conduction region 4, thereby facilitating the movement through tunneling of electrons to the first conduction region 3b disposed at the right side of FIG. 3B.

When an electrode is mounted on the second conduction region 4 and a bias is given via this electrode to the second conduction region 4 as described above, the energy level of the second conduction region 4 can be effectively raised in relative to the first conduction region 3a. The mounting of an electrode on the second conduction region 4 is effective in the situation where the difference in energy level between the second conduction region 4 and the first conduction regions 3a and 3b is large.

FIG. 3C illustrates a state when the bias is cut off as in the case of FIG. 1C of the first embodiment.

Next, various specific examples of this invention will be explained in details.

Figure 4:
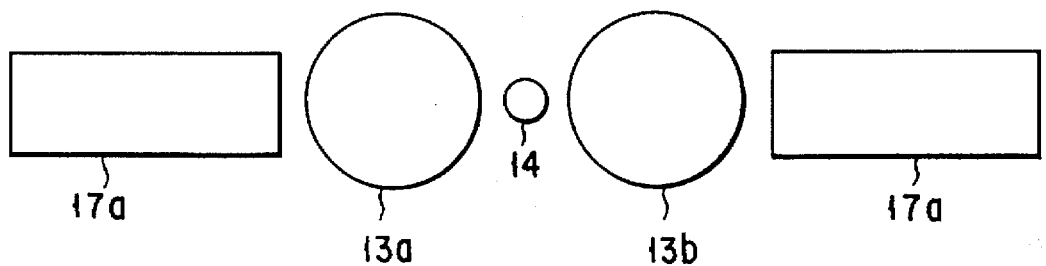
FIG. 4 is a plan view showing a semiconductor memory device according to a first example of this invention.
Figure 5:
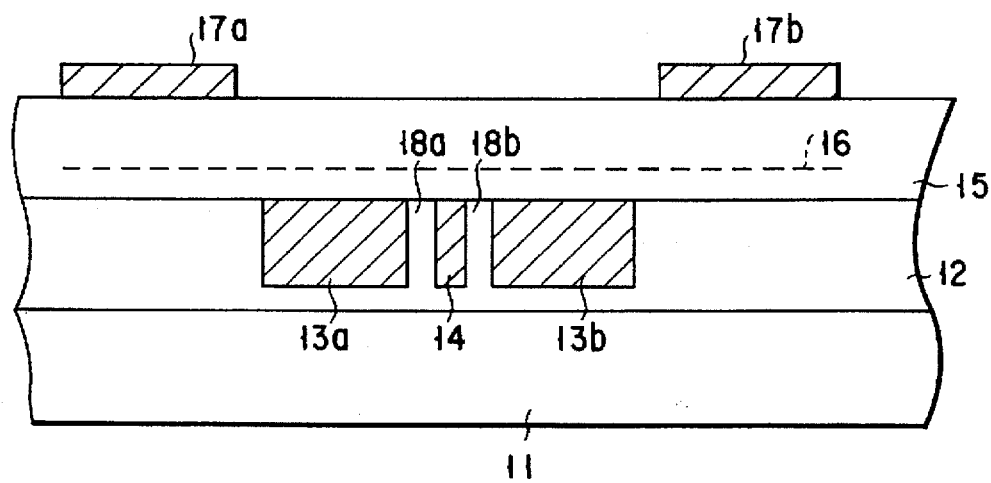
FIG. 5 is a cross-sectional view showing a semiconductor memory device according to a first example of this invention.

FIG. 4 illustrates the top surface of the semiconductor memory device according to a first example of this invention, and FIG. 5 is a cross-sectional view of the semiconductor memory device shown in FIG. 4.

As shown in FIG. 4, the semiconductor memory device according to this example of this invention comprises a couple of first semiconductor regions (first conduction regions) 13a and 13b, and a second semiconductor region (a second conduction region) 14, all being arranged in a straight line. The first semiconductor regions 13a and 13b disposed on both side of the second semiconductor region 14 are surrounded by an insulating material and connected with metallic Schottky electrodes 17a and 17b, respectively. Further, tunnel barrier regions 18a and 18b are interposed between the first semiconductor region 13a and the second semiconductor region 14, as well as between the first semiconductor region 13b and the second semiconductor region 14, respectively.

The second semiconductor region 14 is smaller in size as compared with those of the first semiconductor regions 13a and 13b. In this case, the second semiconductor region 14 may be 0.5 nm to 50 nm in diameter, and the first semiconductor region may be 10 to 100 times as large as that of the second semiconductor region 14. The intervals between the second semiconductor region 14 and the first semiconductor region 13a as well as between the second semiconductor region 14 and the first semiconductor region 13b may be 0.5 nm to 50 nm.

Then, as shown in FIG. 5, a barrier layer 12 consisting of Al0.3Ga0.7As is disposed on a substrate 11 consisting of GaAs, and at the same time, a couple of first semiconductor regions 13a and 13b each consisting of GaAs, and a second semiconductor region 14 consisting of GaAs, all being arranged in a straight line, are also formed on the substrate 11. Although the first semiconductor regions 13a and 13b are provided with a function of confining electrons, they are not so dimensioned as to be quantized. Whereas, the second semiconductor region 14 is sufficiently smaller in size than the first semiconductor regions 13a and 13b, so that it is three-dimensionally quantized. In this case, the minimum energy level of the second semiconductor region 14 as quantized in this manner is sufficiently higher as compared with the energy level of the first semiconductor regions 13a and 13b.

A modulation dope layer 15 consisting of Al0.3Ga0.7As is formed all over the surfaces of the barrier layer 12 consisting of Al0.3Ga0.7As, the first semiconductor regions 13a and 13b, and the second semiconductor region 14. For the purpose of supplying electrons to the first semiconductor region 13, a delta-doping of Si to be functioned as a donor is performed on this modulation dope layer 15.

On this modulation dope layer 15 are formed a pair of Schottky electrodes 17a and 17b each consisting of Au for applying a bias to the first semiconductor regions 13a and 13b.

As explained above, the first semiconductor regions 13a and 13b each consisting of GaAs of narrow band gap are entirely (excluding the upper surfaces thereof) buried in the barrier layer 12 consisting of Al0.3Ga0.7As having a wider band gap than GaAs. Since the second semiconductor region 14 is fairly smaller in size as compared with the first semiconductor regions 13a and 13b and is quantized, the energy level of the second semiconductor region 14 is higher than those of the first semiconductor regions 13a and 13b, though the second semiconductor region 14 is also formed of GaAs. In this case, tunnel barrier regions 18a and 18b each consisting of Al0.3Ga0.7As are also interposed between the first semiconductor region 13a and the second semiconductor region 14, as well as between the first semiconductor region 13b and the second semiconductor region 14, respectively.

The manufacture of this structure can be performed as follows. Namely, first of all, the first semiconductor regions 13a and 13b and the second semiconductor region 14 are formed by a patterning step with the employment of ordinary photolithography and a subsequent etching step. Then, a semiconductor layer having a wide band gap than these semiconductor regions or an insulating layer is grown by means of a selective growth method, such as the molecular beam epitaxial growth method (MBE) or the metal organic chemical vapor deposition method (MOCVD), thereby forming the barrier layer 12 so as to bury the first semiconductor regions 13a and 13b as explained above.

Figure 6:
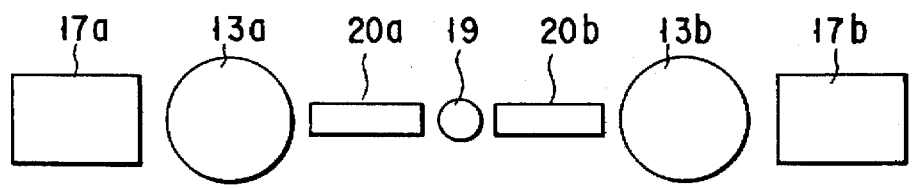
FIG. 6 is a plan view showing a semiconductor memory device according to a second example of this invention.

FIG. 6 illustrates the top surface of the semiconductor memory device according to a second example of this invention. In the case of this semiconductor memory device, the second semiconductor region (the second conduction region) is partitioned into a plurality of regions, i.e. a semiconductor region 19 which is three-dimensionally quantized and a couple of semiconductor regions 20a and 20b each two-dimensionally quantized and disposed respectively on both sides of the semiconductor region 19 are formed.

It is possible with this structure to further stabilize the confinement effect of the electrons that have been confined in the first semiconductor regions (the first conduction regions) 13a and 13b when no voltage is applied thereto.

In this example, the energy for allowing the passage of electrons between the three-dimensionally quantized region 19 and the two-dimensionally quantized semiconductor regions 20a and 20b takes intermittent values, so that an inconsistency in energy level is caused to generate between these regions. As a result, the counter-flow of electrons may become more difficult to occur as compared with where the second semiconductor region is constituted solely by the three-dimensionally quantized region.

In this case, the size of the confinement direction is required to be smaller than the de Broglie wave length that can be determined by the effective mass of electrons ($\lambda = h/mv$: $\lambda$ is de Broglie wave length; h is Plank's constant; m is the effective mass of electrons; and v is Fermi velocity). For example, when the confinement region is formed of GaAs, the size of the confinement direction may be not more than 50 nm. The size of unquantized direction in the two-dimensionally quantized region may typically be several hundreds nanometers, or may possibly be about 50 nm where a weak confinement may be caused to occur. On the other hand, the distance between the confinement regions should desirably be at most approximately the de Broglie wave length in view of allowing electrons to pass through, by the tunneling effect, the space between the confinement regions.

Figure 7:
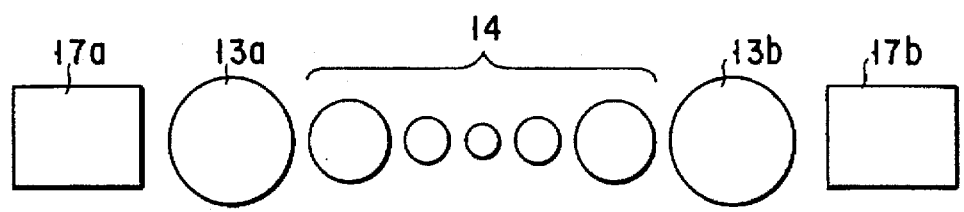
FIG. 7 is a plan view showing a semiconductor memory device according to a third example of this invention.

FIG. 7 illustrates the top surface of the semiconductor memory device according to a third example of this invention. In the case of this semiconductor memory device, the second semiconductor region (the second conduction region) 14 is partitioned into a plurality of regions in such a manner that the location of a partitioned region is further distanced away from the first semiconductor region, the size of the partitioned region becomes smaller, and hence the partitioned region which is disposed at the center, i.e. the remotest from the first semiconductor region, is the smallest among the partitioned regions. When the second semiconductor region 14 is constructed in this manner, the quantized energy level of the second semiconductor region becomes higher as they are further distanced away from the first semiconductor regions 13a and 13b.

When the semiconductor memory device is constructed in this manner, it is possible to further stabilize the confinement effect of electrons confined in the first semiconductor regions 13a and 13b at the occasion where no voltage is being applied thereto.

According to this example, the second semiconductor region 14 is constituted by a plurality of quantized dots. Therefore, since the energy of each quantized dot is completely discretized in this manner, it is required, if electric current is to be passed through between the dots, to make uniform the energy levels of all of the dots. However, since it is very difficult to make uniform the energy levels of all of the dots at the occasion where no voltage is being applied thereto, the counter-flow of electrons would hardly take place under such circumstances, thus further stabilizing the operation of the memory device.

The quantized dots constituting the second semiconductor region 14 are required to be confined three-dimensionally. However, as explained above with reference to the second example, the size of the confinement direction is required to be smaller than the de Broglie wave length that can be determined by the effective mass of electrons. For example, when the confinement region is formed of GaAs, the length of the confinement direction should preferably be not more than 50 nm. Further, the distance between the quantized dots should desirably be not more than the de Broglie wave length in view of allowing electrons to pass through, by the tunneling effect, the space between the quantized dots.

Figure 8:
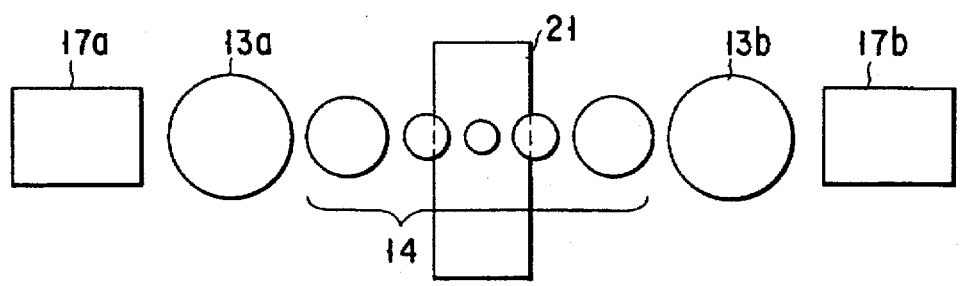
FIG. 8 is a plan view showing a semiconductor memory device according to a fourth example of this invention.

FIG. 8 illustrates the top surface of the semiconductor memory device according to a fourth example of this invention. In the case of this semiconductor memory device, the second semiconductor region (the second conduction region) 14 is partitioned into a plurality of regions in such a manner that the location of a partitioned region is further distanced away from the first semiconductor regions (the first conduction regions) 13a and 13b, and at the same time, a gate electrode 21 is formed at the center of the second semiconductor region 14. This gate electrode 21 is constructed so as to form an insulated metallic Schottky electrode. When such an electrode is mounted on the second semiconductor region 14, the control of quantum level at the center of the semiconductor confinement region may become possible, thus further ensuring the polarization effect to be obtained.

The conditions to be imposed on the quantized dots constituting the second semiconductor region 14 are fundamentally the same as those of the aforementioned example 3. There is any particular limitation on the Schottky electrode 21 as far as it is formed over the second semiconductor region 14. The entire laminar structure of the these components may be the same as that shown in FIG. 5 if they are assumed to be formed of AlGaAs/GaAs type structure.

Figure 9:
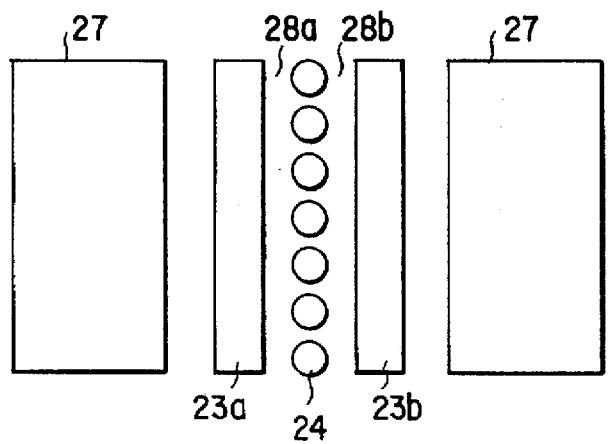
FIG. 9 is a plan view showing a semiconductor memory device according to a fifth example of this invention.

FIG. 9 illustrates the top surface of the semiconductor memory device according to a fifth example of this invention. In the case of this semiconductor memory device, the first semiconductor confinement regions (conduction regions) 23a and 23b are rectangular in shape, and a plurality of partitioned second semiconductor confinement regions (the second conduction regions) 24 are arranged in parallel with and along the longitudinal direction of the first semiconductor confinement regions. The second semiconductor confinement regions 24 in this example are constituted by three-dimensionally quantized dots. The electrodes 27a and 27b for applying a voltage to the first semiconductor confinement regions 23a and 23b are also arranged in parallel with and along the longitudinal direction of the first semiconductor confinement regions 23a and 23b.

A couple of tunnel barrier regions 28a and 28b are interposed between the first semiconductor confinement region 23a and the second semiconductor confinement regions 24, as well as between the first semiconductor confinement region 23b and the second semiconductor confinement regions 24.

In the case of the first example, the current passage of the second semiconductor confinement regions is constituted by only one rout. In this example however, all of the plurality of the second semiconductor confinement regions constitute a rout for current passage. Therefore, the number of the routs for current passage is increased in this example as compared with the example where the rout for current passage is only one, so that the time required for switching of memory can be shortened, thus making it possible to realize a high speed memory operation.

The first semiconductor confinement regions 23a and 23b may not necessarily be required to be quantized other than the thickness-wise thereof. However, these regions 23a and 23b may quantized in perpendicular to the longitudinal direction thereof with the confinement distance in this case being maintained within the de Broglie wave length. With respect to the longitudinal direction, there is not any particular limitation and the confinement distance may be longer than the de Broglie wave length. As for the quantum dots constituting the second semiconductor confinement regions 24, the confinement distance should not be longer than the de Broglie wave length in any confinement directions. If AlGaAs/GaAs type material is to be employed in particular for the device, the dimension in the confinement direction should preferably be set to 50 nm or less.

FIG. 10 illustrates the top surface of the semiconductor memory device according to a sixth example of this invention. The fundamental structure of this semiconductor memory device is the same as that of the aforementioned example 5. However, an insulated metallic Schottky electrode 28 is formed over the second semiconductor confinement region (conduction region) 26 in this example. When such a control electrode is mounted on the second semiconductor confinement region 26 in this manner, the controllability of the device can be improved.

FIG. 11 illustrates a cross-sectional view of the semiconductor memory device according to a seventh example of this invention. This memory device comprises a couple of first conduction regions 33a and 33b each formed of an n-type polycrystalline silicon, a second conduction region 34 formed of Si quantum dots (nano-crystals), and a third conduction region 32 substituting one of the insulating gate electrodes mounted for controlling the electric potential of the first conduction regions 33a and 33b. Namely, the second conduction region 34 is sandwiched between a pair of the first conduction regions 33a and 33b, forming a sandwiched body, and the third conduction region 32 formed of a p-type Si is disposed on the bottom surface of the sandwiched body, thereby forming a vertical memory device.

Furthermore, a gate electrode 36 is formed via an insulating region 35a on the upper surface of the first conduction region 33a. On the left and right sides of the third conduction region 32 disposed in opposite to the first conduction region 33a are formed a source region 37a and a drain region 37b each consisting of an n-type silicon. The insulating region 35a interposed between the gate electrode 36 and the first conduction region 33a, a tunnel barrier region 38a interposed between the first conduction region 33a and the second conduction region 34, a tunnel barrier region 38b interposed between the first conduction region 33b and the second conduction region 34, and an insulating region 35b interposed between the first conduction region 33b and the third conduction region 32 are all formed of a silicon oxide film.

The thickness of the-silicon oxide film employed for use as the tunnel barrier regions 38a and 38b may be of the same as the de Broglie wave length of electron, whereas the thickness of the silicon oxide film employed for use as the insulating region 35a and 35b should be the same as or larger than the de Broglie wave length and at the same time thicker than those of the tunnel barrier regions 38a and 38b.

This memory device is fundamentally a floating gate type silicon MOSFET, so that it can be manufactured by merely modifying only the floating gate portion in the process of manufacturing an ordinary MOSFET.

The second conduction region 34 of this memory device may be formed by making use of silicon quantum dots (nano-crystals) which is sandwiched between polycrystalline silicon layers. The size of the silicon quantum dots is required to be smaller than the de Broglie wave length that can be determined by the effective mass of electrons, e.g. 10 nm or less in this case. The silicon quantum dots (nano-crystals) may be formed by depositing silicon particles on the silicon oxide film, the silicon particles being formed for instance by making use of a high-frequency plasma.

On the other hand, the distance between the first conduction regions 33a and 33b should desirably be not larger than the de Broglie wave length in view of allowing electrons to tunnel through the space between the first conduction regions 33a and 33b, e.g. 5 nm or less in this case.

The principle of the operation of this memory device is fundamentally the same as in the case of example 1 except that this example is featured in that the readout of memory is performed in accordance to the magnitude of the current. Namely, when a voltage is applied between the source and the drain, the magnitude of drain current changes greatly depending on the region in which electrons are mainly accumulated among the first conduction regions 33a and 33b, i.e. if electrons are mainly accumulated in the first conduction region 33a disposed on the gate electrode 36 side, or in the first conduction region 33b disposed on the third conduction region 32 (channel) side, thus making it possible to easily perform the readout of memory.

It is also possible to form the first conduction region 33b disposed on the channel side with a p-type polysilicon among the couple of the first conduction regions 33a and 33b shown in FIG. 11, while forming the first conduction region 33a disposed on the gate electrode 36 side with an n-type polysilicon. In this case, nothing is doped in the second conduction region.

In this case, a p-n junction will be resulted between the first conduction regions 33a and 33b. However, when a reverse bias is applied to this p-n junction, electrons from the valence band of p-type polysilicon is injected through tunneling into nano-crystals of the second conduction region and at the same time, holes are formed in the p-type polysilicon, and hence the p-type polysilicon is charged with "+". Accordingly, the p-type region which is ordinary electrically neutral is now charged with "+", thus causing the threshold value of the FET to change thereby performing the storage of memory.

When an additional reverse bias is further applied to the p-n junction, electrons in the second conduction region is injected through tunneling into the first conduction region 33a, and at the same time, electrons in the valence band of p-type polysilicon on the channel side is injected again through tunneling into nano-crystals of the second conduction region, resulting in the accumulation of holes twice as much as that of the initial holes in the first conduction region 33b on the channel side, thus causing the threshold value of the FET to change more prominently thereby making it possible to perform a multiple storage of memory.

On the other hand, when forward bias is applied to the p-n junction, the electrons return back to the first conduction region 33b disposed on the channel side to recombine with the holes, thereby causing the first conduction region 33b to return back to the original neutral state, thus erasing the memory therein. In this case, because of Coulombic repulsion between electrons, only one electron is allowed to inter into the nano-crystal as it is pushed from the back thereof in the occasion of injecting electrons into nano-crystals. Therefore, the control in number of electrons can performed very accurately, and hence the change in threshold value of the FET would be also brought about very accurately.

Figure 12A:
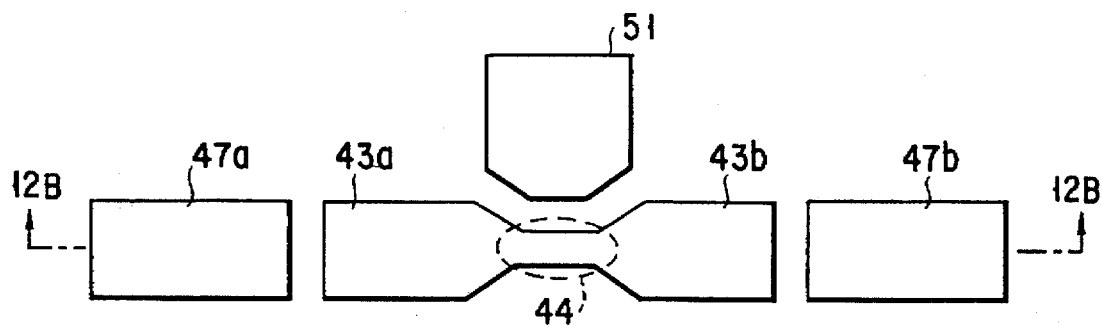
FIG. 12A is a plan view showing a semiconductor memory device according to an eighth example of this invention.
Figure 12B:
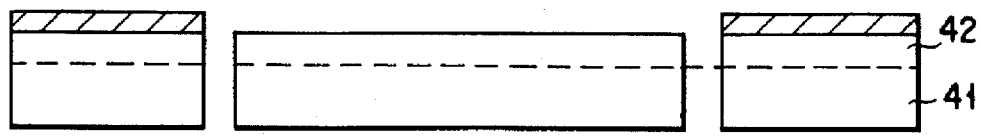
FIG. 12B is a cross-sectional view showing a semiconductor memory device according to a eighth example of this invention.

FIG. 12A shows a plan view of a semiconductor memory device according to an eighth example of this invention, and FIG. 12B is a cross-sectional view taken along the line 12B—12B of FIG. 12A.

Referring to these FIGS., Si is planar-doped into a GaAs layer to form a planar-doped region 42 on the surface of a substrate 41. Thereafter, a couple of first conduction regions 43a and 43b, and a second conduction region 44 are formed on the upper surface of the substrate 41 in such a manner that the second conduction region 44 is interposed between the first conduction regions 43a and 43b. In this case, the second conduction region 44 is sufficiently bottlenecked in relative to the first conduction regions 43a and 43b so as to make it into a channel width. Control electrodes 47a, 47b and 51 are mounted on a couple of the first conduction regions 43a and 43b as well as on the second conduction region 44, respectively. The connection of these control electrodes 47a, 47b and 51 to these regions are effected via an insulating layer or via Schottky connection.

Since the width of the second conduction region 44 is sufficiently narrower than those of the first conduction regions 43a and 43b, the energy level of the second conduction region 44 is sufficiently higher than those of the first conduction regions 43a and 43b. Therefore, when a potential difference is imposed between the first conduction regions 43a and 43b, the carriers are forced to move via this second conduction region 44 from one of the first conduction regions 43a and 43b to the other.

In this occasion, the planar-doped region in the second conduction region 44 which is bottlenecked functions as a conductive portion for the electrons. Since Si which is functioning as a donor is dispersed at random in the interior of the second conduction region 44 in this occasion, the potential barrier is also formed at random, thus forming a substantial multi-tunneling barrier.

Figure 13:
FIG. 13 is a band-diagram showing a semiconductor memory device according to an eighth example of this invention.

FIG. 13 illustrates the band structure of this occasion. Since the energy level for allowing electrons to pass through this random multi-tunneling barrier is irregular, this multi-tunneling barrier functions to prevent the electrons accumulated at one of the first conduction regions from passing into the other. Accordingly, the device can be maintained in a more stable state under the condition of not applying a voltage to the first conduction regions, thereby preventing the generation of malfunction resulting from a thermal fluctuation or radioactive rays.

On the other hand, when a potential difference is imposed between the first conduction regions 43a and 43b via the insulating electrode 51 mounted on the second conduction region 44, the random energy barrier may be lowered, thus makes it easy for the electrons to pass through the barrier.

Planar doping of Si is performed on a GaAs layer in this example. Nonetheless, P-type planar doping may be employed in place of the n-type planar doping. Alternatively, npn-type or pnp-type planar doping may be employed to improve the confinement effect in the film thickness-wise direction. It is also possible to utilize the confinement using a hetero-junction such as AlGaAs/GaAs.

The width of the second conduction region 44 in this case should preferably range from 20 to 30 nm, which is the minimum dimension that can be formed by making use of light-exposure method. The first conduction regions 43a and 43b should be wider than the second conduction region 44. Typically, they should be not less than 1.5 times as wide as that of the second conduction region 44.

The aforementioned examples of semiconductor memory devices, excluding example 7, may be manufactured in fundamentally the same process and techniques as employed for the manufacture of the semiconductor memory device of example 1. In this case, a Schottky electrode may be formed at approximately the center of the second semiconductor region by making use of so-called lift-off method in concurrent with the formation of an electrode to be disposed on the first semiconductor region.

Although the use of a GaAs/AlGaAs type material is explained in the above examples, any combination of hetero-junctions that enable the confinement of electrons or holes, such as a combination of Si type materials including Si/SiGe type, Gc/SiGe type or Si/SiO$_2$ type materials may be employed.

It is also possible to employ a combination of a semiconductor material and a polycrystalline material. For example, the first semiconductor region may be formed of monocrystalline silicon and the second semiconductor region may be formed of polycrystalline silicon. It is also possible to form the first semiconductor region with monocrystalline silicon and to form the second semiconductor region with porous silicon. The porous silicon is the one which can be manufactured by immersing a silicon substrate in an acid solution and then by anodizing the substrate while keeping the substrate in the state of plus, and the acid solution in the state of minus.

Figure 14:
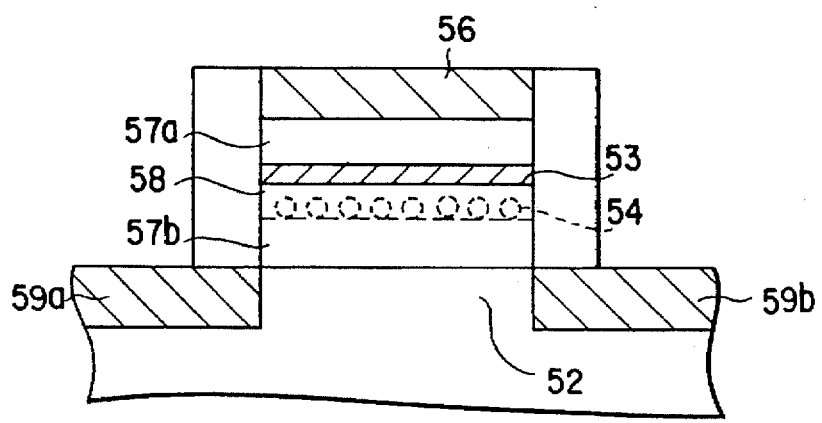
FIG. 14 is a cross-sectional view showing a semiconductor memory device according to a ninth example of this invention.

FIG. 14 illustrates a cross-sectional view of the semiconductor memory according to a ninth example of this invention. In the semiconductor memory device according to this example, n-type polycrystalline silicon is employed for the first conduction region 53, silicon quantum dots for the second conduction region 54, p-type silicon for the third conduction region 52, and a silicon oxide film for the tunnel barrier region 58 interposed between the first and second conduction regions 53 and 54 as well as for the insulating region 57b interposed between the second and third conduction regions 55 and 52. The thickness of the silicon oxide film employed for use as the tunnel barrier regions may preferably be of almost the same as the de Broglie wave length of electron, whereas the thickness of the silicon oxide film employed for use as the insulating regions should be larger than the de Broglie wave length and at the same time thicker than those of the tunnel barrier regions.

In this example, a high-doped n-type polycrystalline silicon is employed for the gate electrode 56, and first conduction region 53, and a high-doped n-type monocrystalline silicon is employed for the source region 59a and also for the drain region 59b. An insulating region 57a interposed between the gate electrode 56 and the first conduction region 53 is also formed with a silicon oxide film. The thickness of this silicon oxide film employed should preferably be larger than the de Broglie wave length of electron, and at the same time, thicker than that of the tunnel oxide film 58 interposed between the first conduction region 53 and the second conduction region 54.

The memory device according to this example can be manufactured by partially modifying the process of manufacturing an ordinary floating gate type MOSFET. The formation of the silicon quantum dot layer may be performed in the same manner as explained with reference to example 7.

In the example shown in FIG. 14, at least either one of the insulating region 57a and the insulating region 57a should preferably be formed with a material whose dielectric constant is larger than that of the tunnel oxide film 58. For example, when $Si_3N_4$ ($\epsilon_r$=7.5); $Ta_2O_5$ ($\epsilon_r$=25); or $Sr_{1-x}Ba_xTiO_3$ ($\epsilon_r$=300 or more), which are larger in value of $\epsilon_r$ than $SiO_2$ ($\epsilon_r$=3.9), is employed, the film thickness of these insulating film may be selected to be larger than that of $SiO_2$, thus making it possible to minimize the tunneling leak current. Moreover, it is possible in this case to improve the high speed operation of the device, since the bias impressed onto the channel and the gate can be effectively transmitted to both of the floating gates.

On the other hand, the tunnel oxide film disposed between the floating gates should preferably be low in dielectric constant. For example, SiOF ($\epsilon_r$=3.2 to 3.9) which is low in dielectric constant may be preferably for use as the tunnel oxide film. This is because if the dielectric constant of the tunnel oxide film is as low as possible in relative to the dielectric constant of the insulating regions 57a and 57b, the gate bias can be more effectively applied between the floating gates.

Further, when a film which is high in dielectric constant is employed for the insulating region 57a, the influence of electric charge of the second conduction region 54 which is a floating gate closely disposed to the channel would be easily imposed on the channel, thus improving the readout sensitivity.

FIGS. 15A to 15C illustrate respectively a band-diagram illustrating the operational principle of an electronic device according to a ninth embodiment of this invention. As shown in FIG. 15A, before a bias is impressed, the first conduction region 53 as well as the second conduction region 54 are kept in the state of neutral. However, when a negative voltage of several volts is impressed onto a gate electrode 56 while allowing the source and drain to be short-circuited and grounded, electrons will be injected via the tunneling effect from the first conduction region 53 to the quantum dots of the second conduction region 53 as shown in FIG. 15B.

Since the quantum dots is as small as several nanometers, only one electron is permitted to be injected under a low voltage of several volts due to the so-called Coulombic blockade effect. Under such circumstances, the first conduction region 53 is charged with plus, and the second conduction region 54 is charged with minus as shown in FIG. 15C, thereby generating a potential difference between these regions.

Accordingly, in contrast to the case where both first and second conduction regions 53 and 54 are kept electrically neutral, when a voltage is impressed between the source and drain, an electric current can be hardly passed through the third conduction region (channel region) 52 since both first and second conduction regions 53 and 54 are now electrically charged. Namely, since the threshold voltage of the transistor can be shifted in this manner, the device can be utilized as a memory.

Although polycrystalline silicon is employed as the first conduction region 53 in this example, the first conduction region 53 may be constituted with quantum dots as in the case of the second conduction region 64 by making use of silicon fine particles (nanocrystal). Further, both first and second conduction regions 53 and 54 may be constituted with polycrystalline silicon.

In the case of devices according to this example and example 7, a MOS type device is employed for the transistor functioning as a readout device. However, it is also possible to employ a transistor formed of a compound semiconductor such as InAlGaAsP, each component being mixed in a suitable ratio, or a thin film transistor (TFT) may be employed instead.

It is also possible, with a view of improving the readout sensitivity of memory, to employ a quantum fine line transistor (quantum fine line is employed for a channeling portion where electric current is to be passed through) as a base for the third conduction regions 52. It is further possible to employ a multi-tunneling junction for the third conduction regions 52.

As explained above, since this invention is featured as a fundamental operation of the device in that a plurality of semiconductor confinement regions each differs in size from the others are arranged and a gate is interposed between these confinement regions so as to deviate electrons, it is possible to provide an electronic device of ultra-low power consumption.

Additional advantages and modifications will readily occur to those skilled in the art. Therefore, the invention in its broader aspects is not limited to the specific details, and representative devices shown and described herein.

Accordingly, various modifications may be made without departing from the spirit or scope of the general inventive concept as defined by the appended claims and their equivalents.

What is claimed is:

1. An electronic device which comprises;

a couple of first conduction regions which are capable of confining carriers;

a second conduction region having a higher energy level than those of said first conduction regions; and a first electrode for impressing a voltage on said first conduction regions;

Wherein, when a voltage is impressed via said first electrode between said couple of first conduction regions, carriers are caused to move due to a tunneling effect from one of said first conduction regions via said second conduction region to the other of said first conduction regions; and when the voltage impressed between said couple of first conduction regions is removed, carriers are confined mainly in said one of said first conduction regions.

2. The electronic device according to claim 1, wherein the energy level of said second conduction region is quantized.

3. The electronic device according to claim 1, which further comprises a second electrode for applying a voltage to said second conduction region so as to lowering the energy level of Said second conduction region.

4. The electronic device according to claim 1, wherein said first electrode is adapted for impressing a voltage between said first conduction regions via an insulating film.

5. The electronic device according to claim 1, wherein said first electrode is Schottky-junctioned to said first conduction regions.

6. The electronic device according to claim 1, wherein said second conduction region is constituted with a random multi-tunnel barrier.

7. The electronic device according to claim 1, wherein said second conduction region is smaller in size than that of said first conduction region.

8. The electronic device according to claim 1, wherein said first conduction regions and said second conduction region are arranged in a substantially straight line.

9. The electronic device according to claim 1, wherein said second conduction region comprises a plurality of sub-conduction regions.

10. The electronic device according to claim 1, wherein said first conduction regions are one-dimensionally or two-dimensionally quantized, and said second conduction region is two-dimensionally or three-dimensionally quantized.

11. The electronic device according to claim 1, wherein said second conduction region comprises a plurality of sub-conduction regions and the energy level of said sub-conduction regions becomes higher as said sub-conduction regions are further distanced away from said first semiconductor region.

12. The electronic device according to claim 1, wherein a modulation dope layer consisting of a semiconductor region doped with an impurity for generating a carrier is formed on said first conduction regions and on said second conduction region.

13. The electronic device according to claim 1, wherein said electronic device is a memory device.

14. An electronic device which comprises;

a first conduction region and a second conduction region both of which are capable of confining carriers;

a third conduction region wherein carriers are free to move;

a first electrode for impressing a voltage on said first conduction region; and a second electrode and a third electrode each functioning as an input and an output for passing an electric current to said third conduction region;

wherein either one of an insulating layer and an energy barrier layer is interposed between said first electrode and said first conduction region, between said first conduction region and said second conduction region, and between said second conduction region and said third conduction region; and when a voltage is impressed between said first electrode and either one of said second and third electrode, or between said first electrode and said second and third electrodes, carriers are caused to move due to a tunneling effect between said first conduction regions and said second conduction region, while the carriers are inhibited from moving between said first electrode and said first conduction region as well as between said second conduction region and said third conduction region; and when the voltage impressed is removed, carriers are confined mainly in either one of said first conduction region and said second conduction region.

15. The electronic device according to claim 14, wherein when an electric current is passed while applying a potential difference between said first electrode and said second electrode, a magnitude of the current passing through said third conduction region changes depending on a region where said carrier is mainly confined in either one of said first conduction region and said second conduction region.

16. The electronic device according to claim 15, wherein when said first electrode is assumed to be a gate electrode, said second electrode is assumed to be a source electrode, and said third electrode is assumed to be a drain electrode, an electric current passing between said source and drain is modulated by applying a voltage between said gate electrode and said source or drain electrode in such a manner that the magnitude of said voltage applied is incapable of shifting said carrier between said first conduction regions and said second conduction region.

17. The electronic device according to claim 16, wherein said first conduction regions and said second conduction region comprises an impurity-doped semiconductor or an impurity-doped polycrystalline semiconductor.

18. The electronic device according to claim 16, wherein either said first conduction regions or said second conduction region comprises an impurity-doped polycrystalline semiconductor, and the other comprises an impurity-free polycrystalline semiconductor.

19. The electronic device according to claim 16, wherein said first conduction regions comprises an impurity-doped polycrystalline semiconductor, and said second conduction region comprises an aggregate of particles selected from the group consisting of semiconductor fine particles, metallic fine particles and quantum dots.

20. The electronic device according to claim 16, wherein at least either one of said first conduction regions and said second conduction region comprises either one of an aggregate of metallic fine particles and aggregate quantum dots.

21. The electronic device according to claim 16, wherein said electronic device is a memory device.

* * * * *

UNITED STATES PATENT AND TRADEMARK OFFICE
CERTIFICATE OF CORRECTION

PATENT NO. : 5,670,790
DATED : September 23, 1997
INVENTOR(S) : Riichi KATOH et al.

It is certified that error appears in the above-indentified patent and that said Letters Patent is hereby corrected as shown below:

On the title page, Item [73], the Assignee should read:

-- Kabushiki Kaisha Toshiba --

Signed and Sealed this

Ninth Day of December, 1997

Attest:

BRUCE LEHMAN

Attesting Officer

Commissioner of Patents and Trademarks